(12) United States Patent
Long

(10) Patent No.: US 11,598,998 B2
(45) Date of Patent: Mar. 7, 2023

(54) DISPLAY SUBSTRATE AND DISPLAY DEVICE

(71) Applicant: BOE Technology Group Co., Ltd., Beijing (CN)

(72) Inventor: Chunping Long, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 263 days.

(21) Appl. No.: 16/759,094

(22) PCT Filed: Oct. 18, 2019

(86) PCT No.: PCT/CN2019/111966
§ 371 (c)(1),
(2) Date: Apr. 24, 2020

(87) PCT Pub. No.: WO2020/088279
PCT Pub. Date: May 7, 2020

(65) Prior Publication Data
US 2021/0215964 A1   Jul. 15, 2021

(30) Foreign Application Priority Data

Oct. 31, 2018 (CN) .......................... 201821783481.8

(51) Int. Cl.
*H01L 27/12* (2006.01)
*G02F 1/1362* (2006.01)

(52) U.S. Cl.
CPC ........ *G02F 1/13629* (2021.01); *H01L 27/124* (2013.01)

(58) Field of Classification Search
None
See application file for complete search history.

(56) References Cited

U.S. PATENT DOCUMENTS

| 7,952,652 B2 | 5/2011 | Gao et al. |
| 2020/0004367 A1* | 1/2020 | Lee ..................... G06F 3/03545 |

(Continued)

FOREIGN PATENT DOCUMENTS

| CN | 101364019 A | * | 2/2009 | ........... G02F 1/1345 |
| CN | 101364019 A | | 2/2009 | |

(Continued)

*Primary Examiner* — Steven M Christopher
(74) *Attorney, Agent, or Firm* — Nath, Goldberg & Meyer; Joshua B. Goldberg

(57) ABSTRACT

The application provides a display substrate and a display device. The display substrate includes: gate lines, data lines, the gate lines and the data lines being arranged to intersect to define sub-pixels, every multiple sub-pixels in a same row constituting a pixel unit; and common electrode lines, each of the common electrode lines is between adjacent two of the gate lines. The display substrate further includes common voltage input line groups intersecting with the common electrode lines. Common voltage input lines in different groups are electrically connected to different ones of the common electrode lines, respectively; and an orthographic projection of every N columns of pixel units on a substrate covers an orthographic projection of a corresponding one of the common voltage input line groups on the substrate, where N is an integer greater than or equal to 1.

20 Claims, 10 Drawing Sheets

(56) References Cited

U.S. PATENT DOCUMENTS

2020/0064667 A1\* 2/2020 Tominaga ............. G06F 3/0443
2020/0393926 A1\* 12/2020 Kim ................... G06F 3/04184

FOREIGN PATENT DOCUMENTS

| CN | 204302636 U | 4/2015 | |
|----|-------------|--------|--|
| CN | 104965367 A | 10/2015 | |
| CN | 105652547 A | 6/2016 | |
| CN | 206074968 U | 4/2017 | |
| CN | 107357105 A | 11/2017 | |
| CN | 208795983 U | 4/2019 | |
| EP | E P-3582213 A1 \* | 12/2019 | ........... G06F 3/0412 |

\* cited by examiner

DISPLAY SUBSTRATE AND DISPLAY DEVICE

CROSS REFERENCE TO RELATED APPLICATION

This is a National Phase Application filed under 35 U.S.C. 371 as a national stage of PCT/CN2019/111966, filed Oct. 18, 2019, an application claiming the benefit of Chinese patent application No. 201821783481.8, filed on Oct. 31, 2018, the entire contents of which are incorporated herein by reference.

TECHNICAL FIELD

The present disclosure relates to the field of display technology, in particular to a display substrate and a display device.

BACKGROUND

The liquid crystal display technology is widely applied to the fields of televisions, mobile phones, public information display and the like, and is the most widely used display technology at present. The picture quality of the liquid crystal display is an important condition for the success of the above products, the liquid crystal display device is a commonly used flat panel display at present, a thin film transistor liquid crystal display (TFT-LCD) panel is a mainstream product in the liquid crystal display devices, and the liquid crystal display panel has the advantages of small volume, low power consumption, no radiation, high resolution and the like.

An array substrate (display substrate) is an important component of the liquid crystal display device. In general, a common electrode line is disposed in the array substrate, and the common electrode line can provide a common voltage required by the liquid crystal display. The common voltage signal input to the common electrode line needs to be output by a common voltage input line from a fan-out region of the array substrate.

SUMMARY

In an aspect, the present disclosure provides a display substrate. In an embodiment, the display substrate includes: a plurality of gate lines, each of the plurality of gate lines extending in a first direction; a plurality of data lines, each of the plurality of data lines extending in a second direction substantially perpendicular to the first direction, the plurality of gate lines and the plurality of data lines being arranged to intersect to define a plurality of sub-pixels arranged in a plurality of rows and a plurality of columns, every multiple sub-pixels in a same row constituting a pixel unit; and a plurality of common electrode lines, each of the plurality of common electrode lines extending in the first direction and located between adjacent two of the plurality of gate lines and configured to supply a common voltage to sub-pixels of the plurality of sub-pixels in a same row. The display substrate further includes: a plurality of common voltage input line groups extending in the second direction and intersecting with the plurality of common electrode lines. Common voltage input lines in different groups of the plurality of common voltage input line groups are electrically connected to different ones of the plurality of common electrode lines, respectively; and an orthographic projection of every N columns of pixel units on a substrate covers an orthographic projection of a corresponding common voltage input line group of the plurality of common voltage input line groups on the substrate, where N is an integer greater than or equal to 1.

In an embodiment, the display substrate further includes a common voltage supply circuit. The common voltage supply circuit is electrically connected with the plurality of common voltage input line groups and is configured to provide different common voltages to at least part of common voltage input lines in different groups.

In an embodiment, the multiple sub-pixels include a red sub-pixel, a green sub-pixel, and a blue sub-pixel; and sub-pixels of the plurality of sub-pixels in a same column has a same color. The orthographic projection of the corresponding common voltage input line group on the substrate is within an orthographic projection of a corresponding column of green sub-pixels on the substrate.

In an embodiment, the corresponding common voltage input line group includes one common voltage input line; and the one common voltage input line is electrically connected with multiple adjacent common electrode lines of the plurality of common electrode lines.

In an embodiment, the corresponding common voltage input line group includes a plurality of common voltage input lines. Each of the plurality of common voltage input lines is electrically connected with a corresponding one of the plurality of common electrode lines, the plurality of common voltage input lines are electrically connected with different common electrode lines, and the different common electrode lines are adjacent.

In an embodiment, the corresponding common voltage input line group includes a plurality of common voltage input lines. Each of the plurality of common voltage input lines is electrically connected with multiple common electrode lines of the plurality of common electrode lines, the multiple common electrode lines electrically connected with one of the plurality of common voltage input lines are different from the multiple common electrode lines electrically connected with another one of the plurality of common voltage input lines, and all the common electrode lines electrically connected to the plurality of common voltage input lines are adjacent.

In an embodiment, the corresponding common voltage input line group includes two common voltage input lines, and the two common voltage input lines are on a same side of a corresponding one of the plurality of data lines.

In an embodiment, the corresponding common voltage input line group includes two common voltage input lines, and the two common voltage input lines are located at two sides of a corresponding one of the plurality of data lines, respectively.

In an embodiment, a layer where the plurality of common electrode lines are disposed and a layer where the plurality of common voltage input line groups are disposed are sequentially disposed in a direction away from the substrate, and an interlayer insulating layer is disposed between the layer where the plurality of common electrode lines are disposed and the layer where the plurality of common voltage input line groups are disposed, a via hole is disposed at a position of the interlayer insulating layer corresponding to an intersection of a common electrode line and a common voltage input line, and the common electrode line and the common voltage input line are electrically connected through the via hole.

In an embodiment, the display substrate further includes an auxiliary connection portion; the auxiliary connection portion is arranged at the intersection of the common electrode line and the common voltage input line and is connected with the common electrode line as an integral structure with the common electrode line.

In an embodiment, the display substrate further includes an auxiliary connection portion; the auxiliary connection portion is arranged at a position corresponding to the via hole and is connected with the common electrode line as an integral structure with the common electrode line.

In an embodiment, each of the plurality of common electrode lines includes a plurality of common sub-electrode lines, and first ends of the plurality of common sub-electrode lines are connected together and second ends of the plurality of common sub-electrode lines are connected together.

In an embodiment, the plurality of common voltage input line groups extend to a fan-out region; a plurality of signal input lines are arranged in the fan-out region; an extending direction of the plurality of signal input lines is perpendicular to an extending direction of the plurality of common voltage input line groups; and each common voltage input line is connected with a corresponding one of the plurality of signal input lines.

In another aspect, the present disclosure further provides a display device, which includes any one of the display substrates described herein.

DETAILED DESCRIPTION

In order that those skilled in the art will better understand the technical solutions of the present disclosure, the following detailed description of the present disclosure is given with reference to the accompanying drawings and the specific embodiments.

As shown in FIGS. 1 to 10, in an embodiment of the present disclosure, a display substrate having a pixel region and a fan-out region is provided; the display substrate includes: a plurality of gate lines 1, each of the plurality of gate lines 1 extending in a first direction D1; a plurality of data lines 2, each of the plurality of data lines 2 extending in a second direction D2 substantially perpendicular to the first direction D1, the plurality of gate lines 1 and the plurality of data lines 2 being arranged to intersect to define a plurality of sub-pixels arranged in a plurality of rows and a plurality of columns, every multiple sub-pixels located in a same row constituting a pixel unit A; and a plurality of common electrode lines 3, each of the plurality of common electrode lines 3 extending in the first direction D1 and located between two adjacent gate lines of the plurality of gate lines 2 and configured to supply a common voltage to sub-pixels located in a same row of the plurality of sub-pixels. The display substrate further includes: a plurality of common voltage input line groups extending in the second direction D2 and arranged to intersect with the plurality of common electrode lines 3; Common voltage input lines in different groups of the plurality of common voltage input line groups are electrically connected to different common electrode lines of the plurality of common electrode lines 3, respectively; and an orthographic projection of every N columns of pixel units on a substrate 10 covers an orthographic projection of a corresponding common voltage input line group of the plurality of common voltage input line groups on the substrate 10; where N is an integer greater than or equal to 1.

Because every N columns of pixel units A are provided with a corresponding common voltage input line group, the common voltage input to each sub-pixel in a same pixel unit A can be ensured to be the same, and the problem of color shift is thus avoided. Meanwhile, common voltage input lines 4 in different groups are connected to different common electrode lines 3, that is, different common voltages can be input to the common electrode lines 3 in different rows through the common voltage input lines 4 of different groups, so that the common voltages of at least part of the sub-pixels in the display substrate located in different rows are different, which is beneficial to realizing wide-viewing-angle display.

Figure 1:
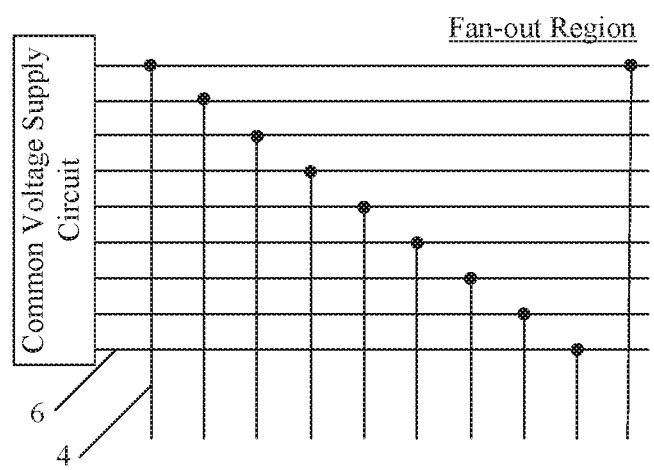
FIG. 1 is a schematic diagram of a fan-out region according to an embodiment of the present disclosure.

As shown in FIG. 1, a plurality of signal input lines 6 are arranged in the fan-out region of a display substrate; an extension direction of the signal input lines 6 is perpendicular to the extension direction of the common voltage input lines 4, and each common voltage input line 4 is connected to its corresponding signal input line 6. Furthermore, a common voltage supply circuit may be further disposed in the fan-out region, and the common voltage supply circuit may be electrically connected to the common voltage input lines 4 through the signal input lines 6 to provide different common voltages to at least some of the common voltage input lines 4 located in different groups, so that the common voltages of at least part of the sub-pixels in the display substrate located in different rows are different, which is beneficial to achieve wide-viewing-angle display.

In order to make the structure of the display substrate in the embodiment of the present disclosure more clear, an example, in which each pixel unit A includes a red sub-pixel (R), a green sub-pixel (G), and a blue sub-pixel (B) and each column of pixel units A (each column of pixel units A includes a column of red sub-pixels, a column of green sub-pixels, and a column of blue sub-pixels) is provided with one corresponding common voltage input line group, will be described.

When the display substrate according to the embodiment of the present disclosure is applied to a liquid crystal panel, the red sub-pixel, the green sub-pixel and the blue sub-pixel respectively correspond to a red color filter, a green color filter and a blue color filter in a color filter layer of a color filter substrate of the liquid crystal panel.

In an embodiment, as shown in FIGS. 2 to 6, a display substrate is provided. The display substrate includes a plurality of gate lines 1, a plurality of data lines 2, a plurality of common electrode lines 3 and a plurality of common voltage input line groups. Each of the common voltage input line groups includes only one common voltage input line 4; the plurality of gate lines 1 and the plurality of data lines 2 are arranged to intersect to define a plurality of sub-pixels (i.e., red, green, and blue sub-pixels shown in FIG. 2); the common electrode line 3 is located between two adjacent gate lines 1; the common voltage input lines 4 are arranged to intersect with the common electrode lines 3, and every adjacent plurality of common electrode lines 3 are connected with one common voltage input line 4.

For example, each pixel unit A includes one red sub-pixel, one green sub-pixel, and one blue sub-pixel which are adjacently arranged; and in this case, one column of red sub-pixels, one column of green sub-pixels and one column of blue sub-pixels which are adjacently arranged form one column of pixel units A; in the present embodiment, one common voltage input line 4 corresponds to one or more columns of pixel units A, and different common voltage input lines 4 correspond to different columns of pixel units A.

Since the display substrate of the present embodiment is provided with the plurality of independent common voltage input lines 4, different common voltages can be input to different common voltage input lines 4, so that the common voltages written onto at least part of the common electrode lines 3 located in different regions are different, which is beneficial for the display substrate to realize wide-viewing-angle display. For example, a VA (vertical alignment) mode display panel generally needs to modulate a common voltage or a pixel voltage to control liquid crystal molecules of at least two different regions to have different tilt angles. In addition, in the present embodiment, one common voltage input line 4 corresponds to one or more columns of pixel units A, and different common voltage input lines 4 correspond to different columns of pixel units A, so that the common voltages written into the sub-pixels in a same pixel unit A are the same, thereby effectively avoiding the problem of color shift.

Figure 2:
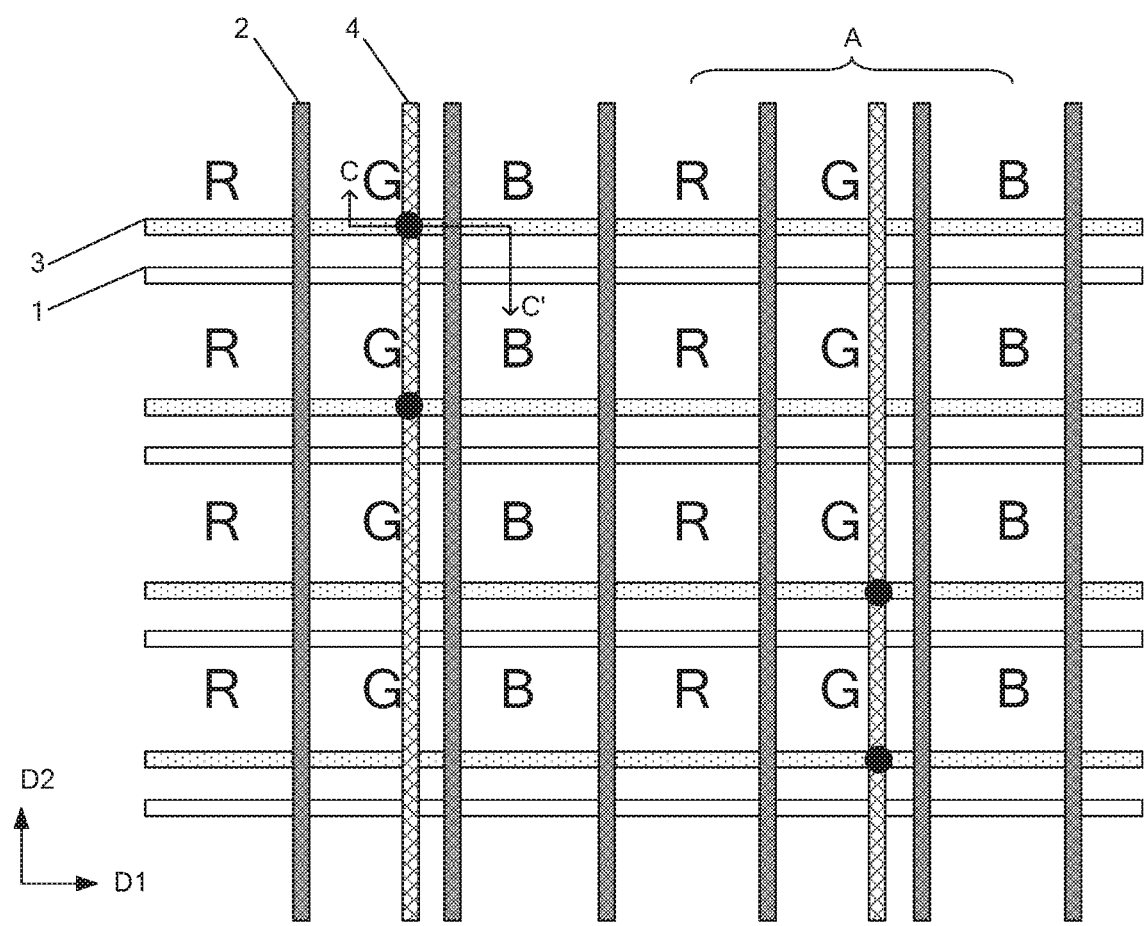
FIG. 2 is a schematic diagram of a structure of a display substrate according to an embodiment of the present disclosure.

In an embodiment, as shown in FIG. 2, sub-pixels in four rows and six columns (i.e., two columns of pixel units A) defined by four gate lines 1 and six data lines 2 in a display substrate are illustrated. Each row of sub-pixels corresponds to one common electrode line 3, and each column of pixel units A corresponds to one common voltage input line 4 (i.e., two common voltage input lines 4 shown in FIG. 2). As shown in FIG. 2, the first common voltage input line 4 is connected with the first and second common electrode lines 3, and the second common voltage input line 4 is connected with the third and fourth common electrode lines 3, so that different common voltages can be input through the first and second common voltage input lines 4, allowing the common voltages in the upper and lower regions of the display substrate to be different, and the display substrate realizes wide-viewing-angle display.

In order to make the display substrate light and thin, in an embodiment, the gate lines 1 and the common electrode lines 3 are disposed in a same layer, and the data lines 2 and the common voltage input lines 4 are disposed in a same layer, in this case, the gate lines 1 and the common electrode lines 3 may be formed by a single patterning process, and the data lines 2 and the common voltage input lines 4 may be formed by a single patterning process, which can simplify the process steps and improve the production efficiency.

Figure 3:
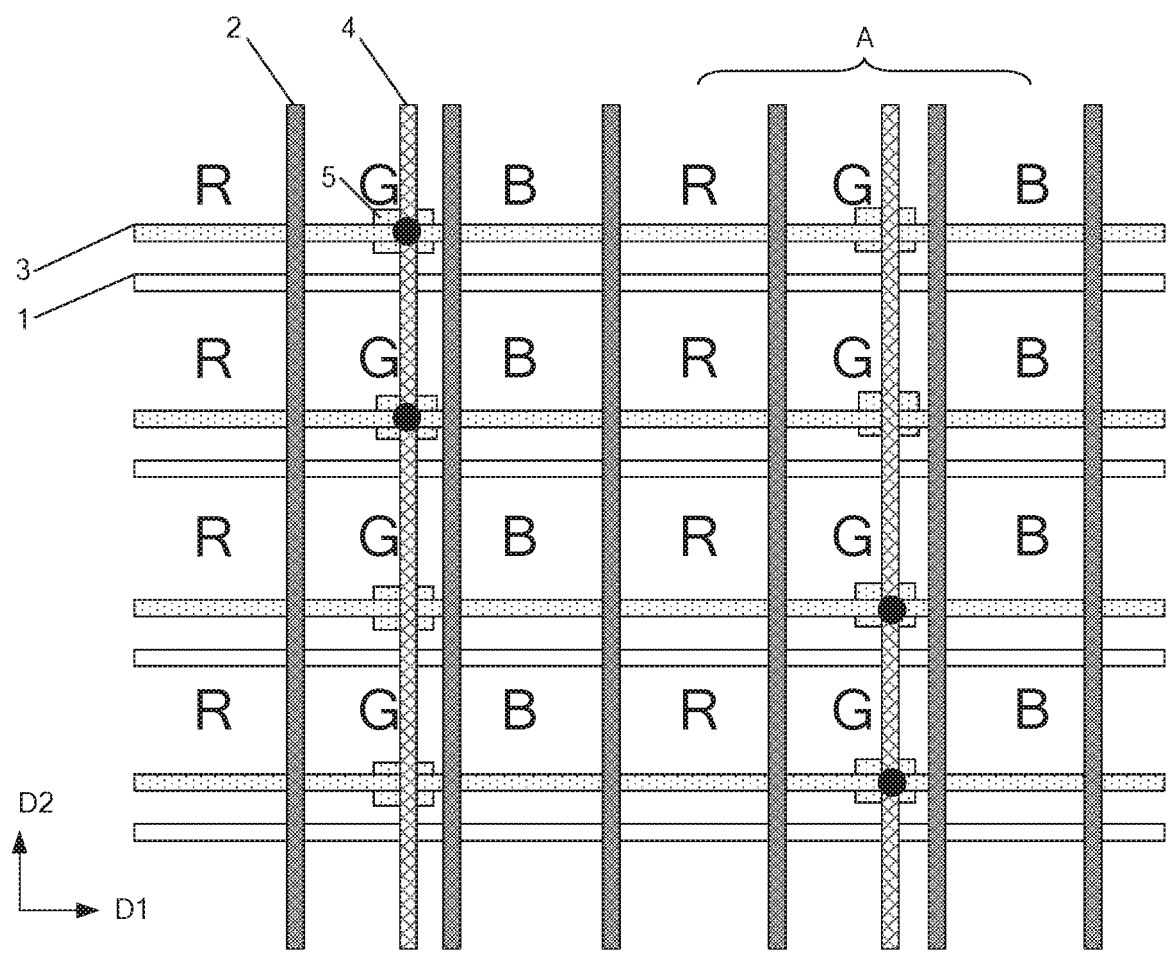
FIGS. 3 and 4 are schematic diagrams illustrating an auxiliary connection portion provided in the display substrate of FIG. 2.
Figure 10:
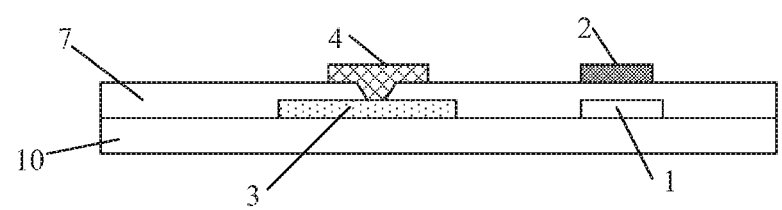
FIG. 10 is a cross-sectional view taken along line C-C' of FIG. 2.

Referring to FIG. 10, since the common electrode lines 3 and the common voltage input lines 4 are disposed in different layers, if the common electrode lines 3 are disposed closer to the substrate 10 than the common voltage input lines 4 and an interlayer insulating layer 7 is required to be disposed therebetween, via holes are disposed at positions of the interlayer insulating layer 7 corresponding to intersections of the common electrode lines 3 and the common voltage input lines 4 so as to electrically connect the common electrode lines 3 and the common voltage input lines 4. However, since both the common electrode lines 3 and the common voltage input lines 4 are relatively thin, the positions of the via holes need to be precise enough to ensure good electrical connection between the common electrode lines 3 and the common voltage input lines 4. In order to solve the problem, in an embodiment and as shown in FIG. 3, an auxiliary connection portion 5 integrally connected to the common electrode line 3 is disposed at a position of the common electrode line 3 corresponding to the via hole, and an area of the auxiliary connection portion 5 is larger than that of the via hole, so as to ensure the good electrical connection between the common electrode line 3 and the common voltage input line 4. Needless to say, if the common voltage input line 4 is disposed closer to the substrate 10 than the common electrode line 3, the auxiliary connection portion 5 and the common voltage input line 4 are connected as one-piece structure.

Figure 4:
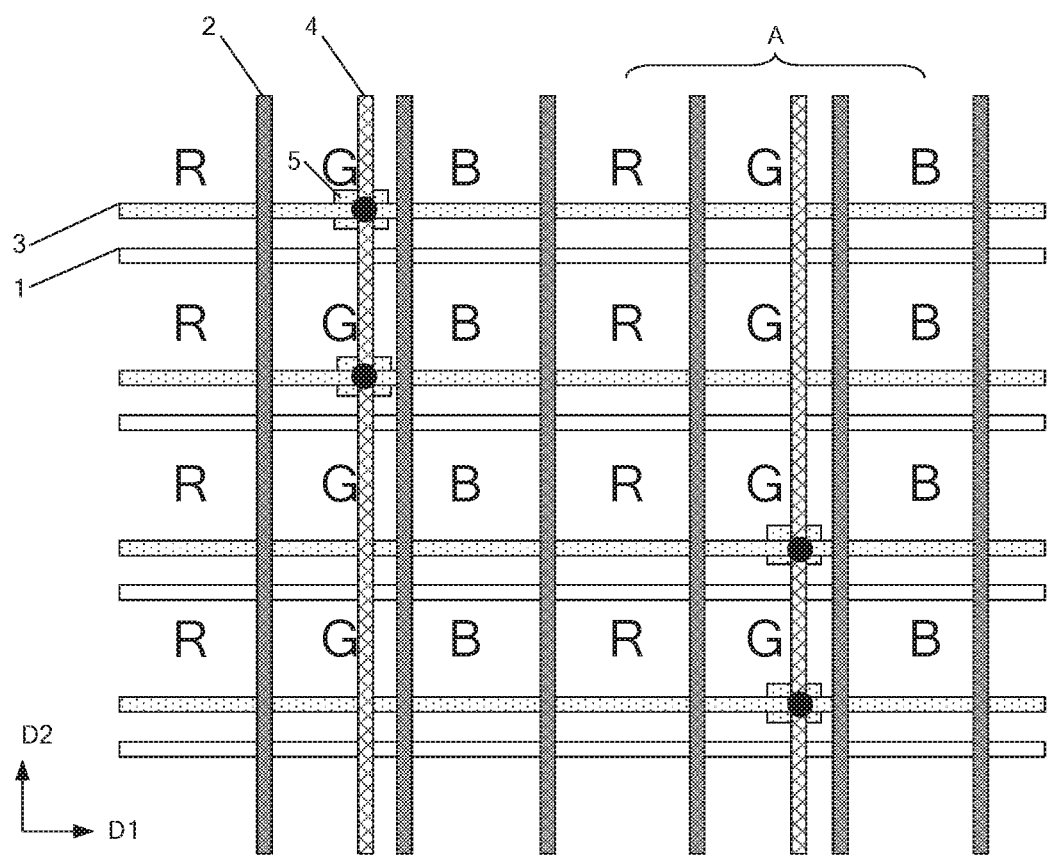

In an embodiment, the common electrode line 3 and the auxiliary connection portion 5 are integrally formed, that is, they can be prepared by a single patterning process. In an embodiment, as shown in FIG. 4, the auxiliary connection portion 5 may not be provided at all positions corresponding to the intersections of the common electrode line 3 and the common voltage input lines 4, and the auxiliary connection portion 5 may be provided only at the position(s) where the common electrode line 3 and the common voltage input lines 4 need to be electrically connected, thereby increasing the pixel aperture ratio of the display substrate.

In an embodiment, the common voltage input line 4 is disposed corresponding to the column of the green sub-pixels. For example, an orthographic projection of the common voltage input line 4 on the substrate 10 is within an orthographic projection of one column of green sub-pixels on the substrate 10, as shown in FIG. 4. This is because the green sub-pixel has a higher transmittance than the red and blue sub-pixels, and the arrangement of the common voltage input line 4 at the column of the green sub-pixels can prevent color shift.

Figure 5:
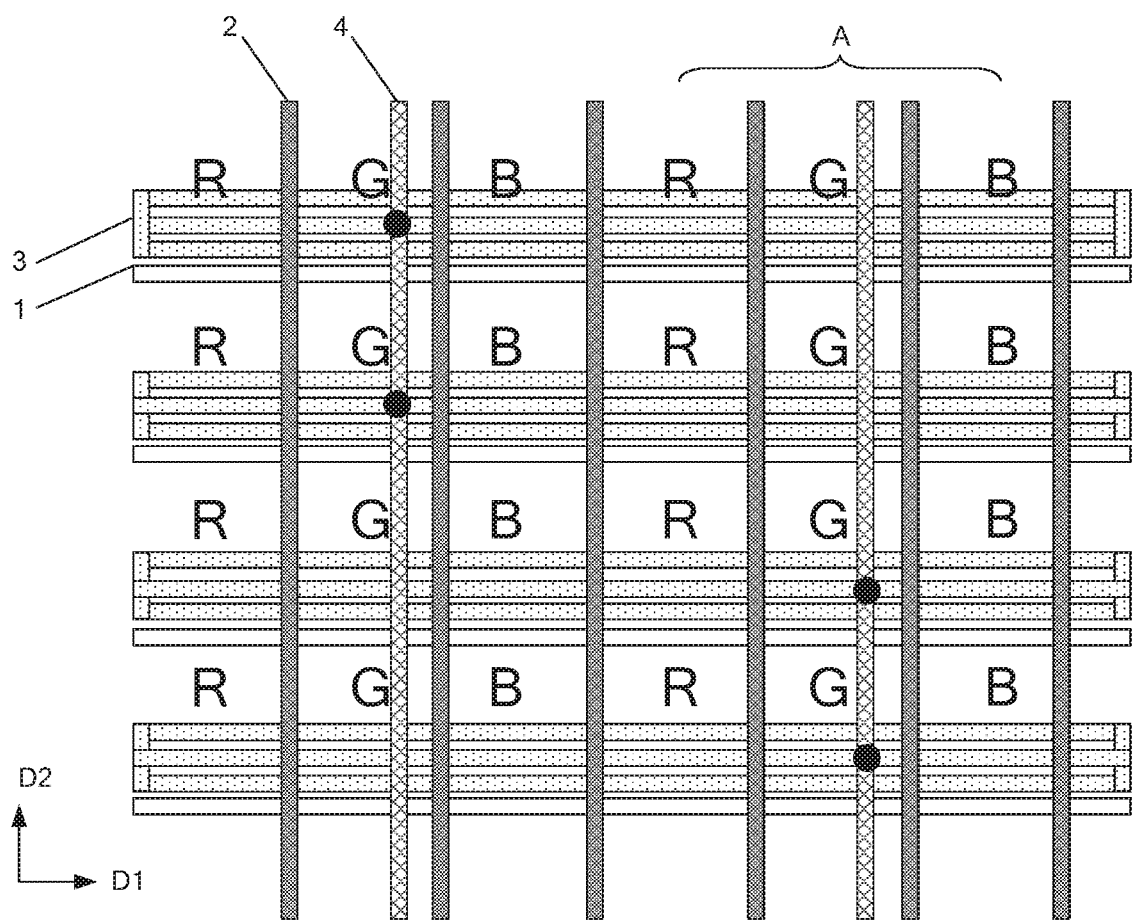
FIG. 5 is a schematic diagram of a structure of a common electrode line in the display substrate of FIG. 2.

In an embodiment, as shown in FIG. 5, each common electrode line 3 may be composed of a plurality of common sub-electrodes, the plurality of common sub-electrodes may be arranged in parallel or approximately in parallel, and one ends of the plurality of common sub-electrodes are connected through a strip-shaped electrode, and the other ends thereof are connected through another strip-shaped electrode. In this case, part of the common sub-electrodes in each common electrode line 3 may be used as an electrode of a storage capacitor, so as to improve the storage capacitance value and reduce display defects such as flicker and leakage current. Further, the common electrode having such structure has a large area, so that the uniformity of the common voltage in the pixel region is improved, and the display uniformity of the pixel region is improved.

Figure 6:
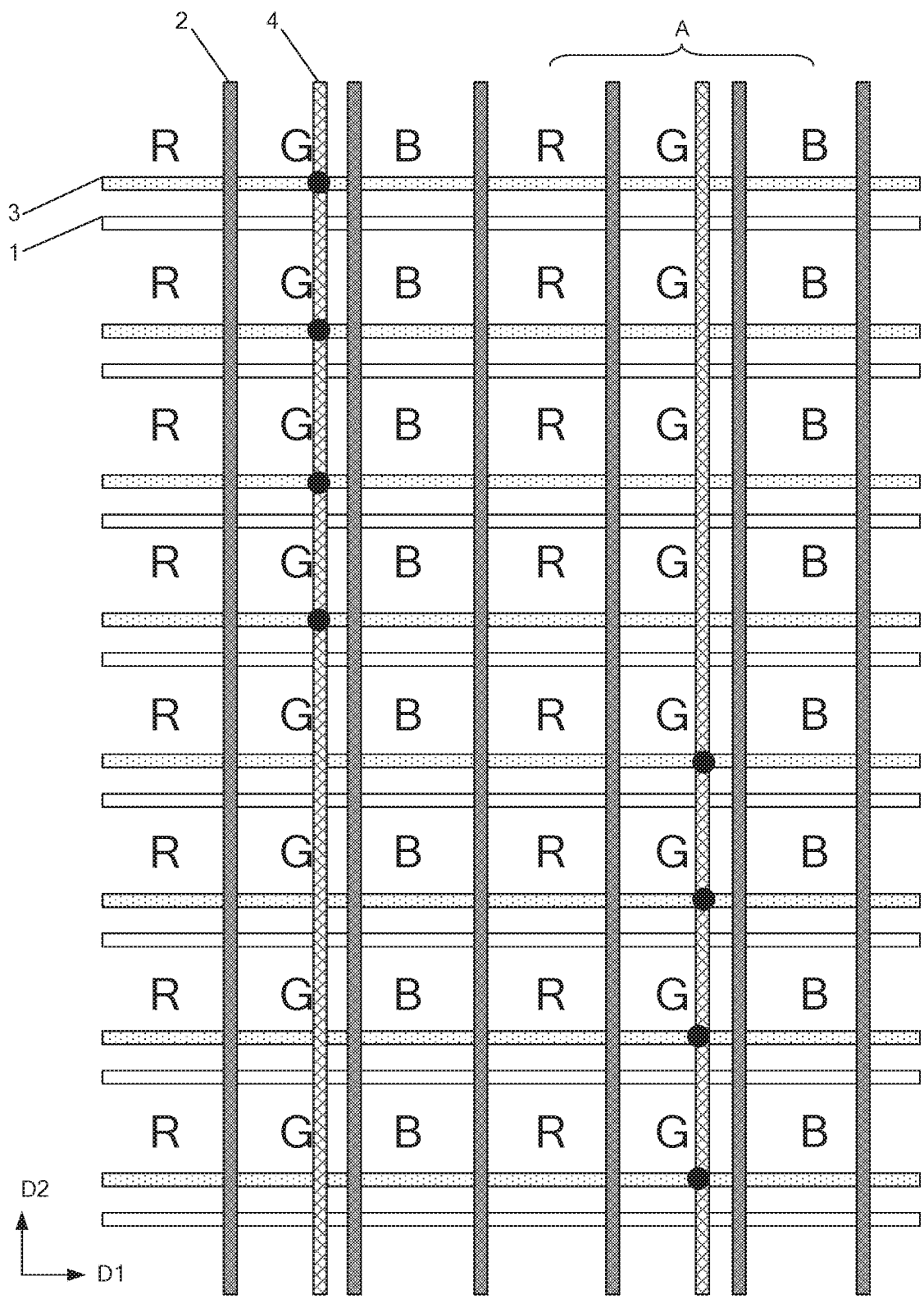
FIG. 6 is a schematic diagram of a structure of another display substrate according to an embodiment of the present disclosure.

In an embodiment, as shown in FIG. 6, sub-pixels in eight rows and six columns (i.e., two columns of pixel units A) defined by eight gate lines 1 and six data lines 2 in a display substrate are illustrated. Each row of sub-pixels corresponds to one common electrode line 3, and each column of pixel units A corresponds to one common voltage input line 4 (i.e., two common voltage input lines 4 shown in FIG. 6). As shown in FIG. 6, the first common voltage input line 4 is connected with the first to fourth common electrode lines 3, and the second common voltage input line 4 is connected with the fifth to eighth common electrode lines 3, so that different common voltages can be input through the first and second common voltage input lines 4, allowing the common voltages in the upper and lower regions of the display substrate to be different, and the display substrate realizes wide-viewing-angle display.

It should be noted that, although one common voltage input line 4 is shown to be connected with two or four common electrode lines 3, it does not mean that one common voltage input line 4 can only be connected with two or four common electrode lines 3, the number of the common voltage input lines 4 and the number of the common electrode lines 3 connected to each common voltage input line 4 depend on the size of the display substrate, or the like.

Figure 7:
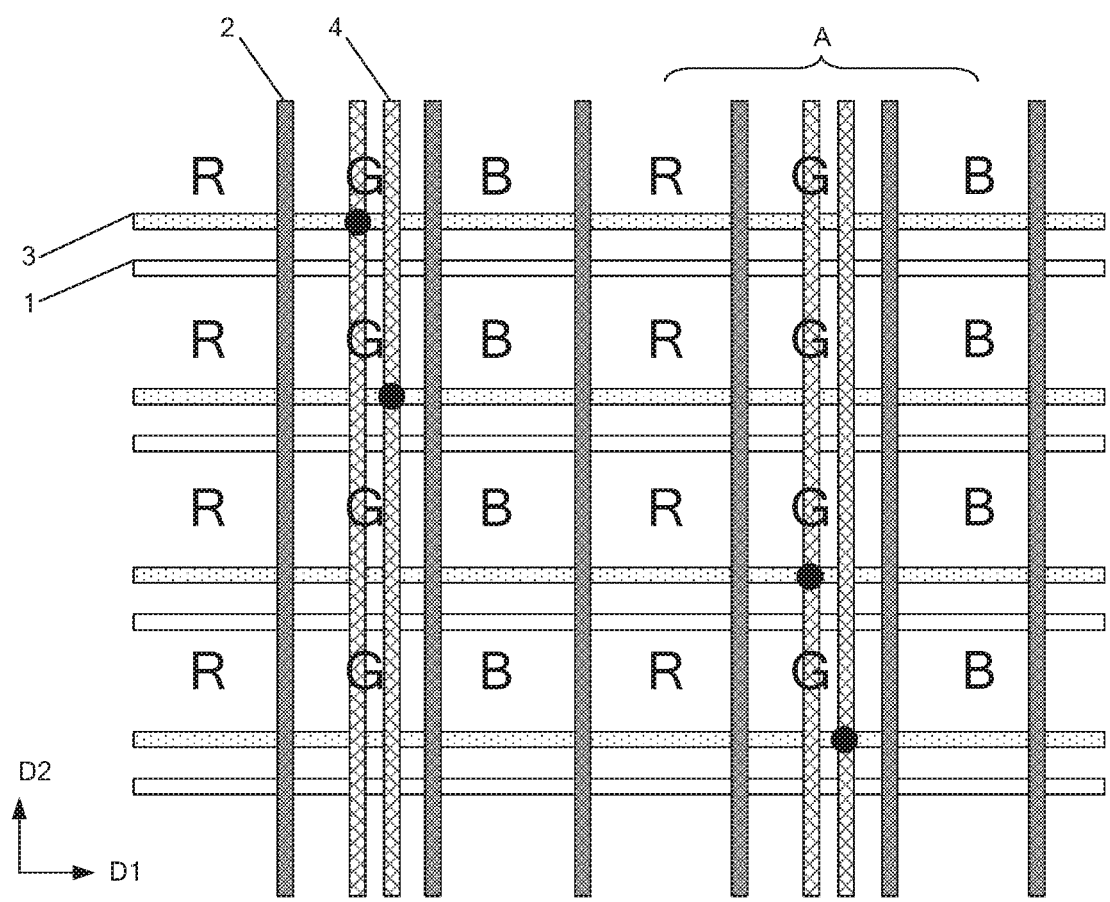
FIG. 7 is a schematic diagram of a structure of another display substrate according to an embodiment of the present disclosure.
Figure 8:
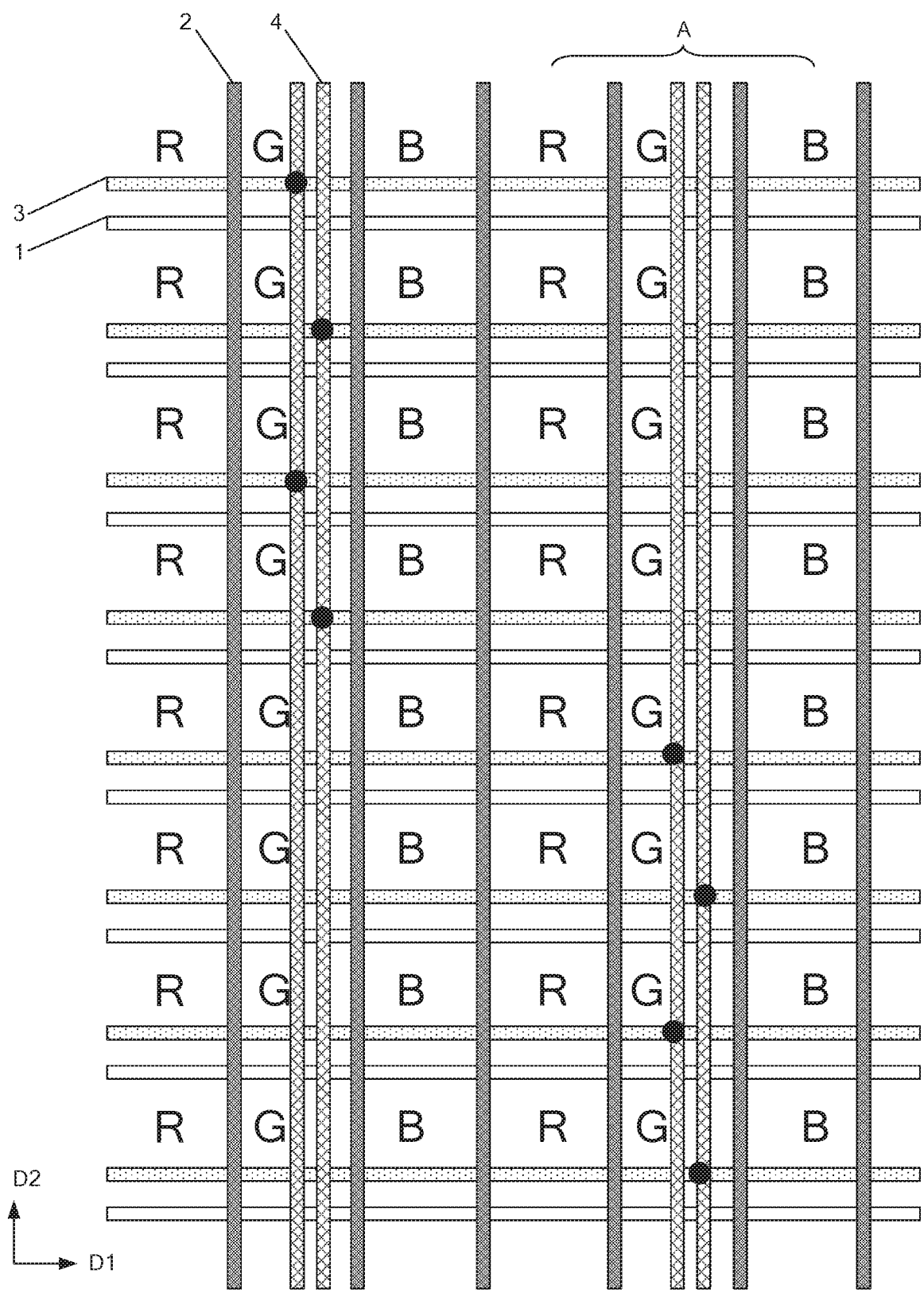
FIG. 8 is a schematic diagram of a structure of another display substrate according to an embodiment of the present disclosure.
Figure 9:
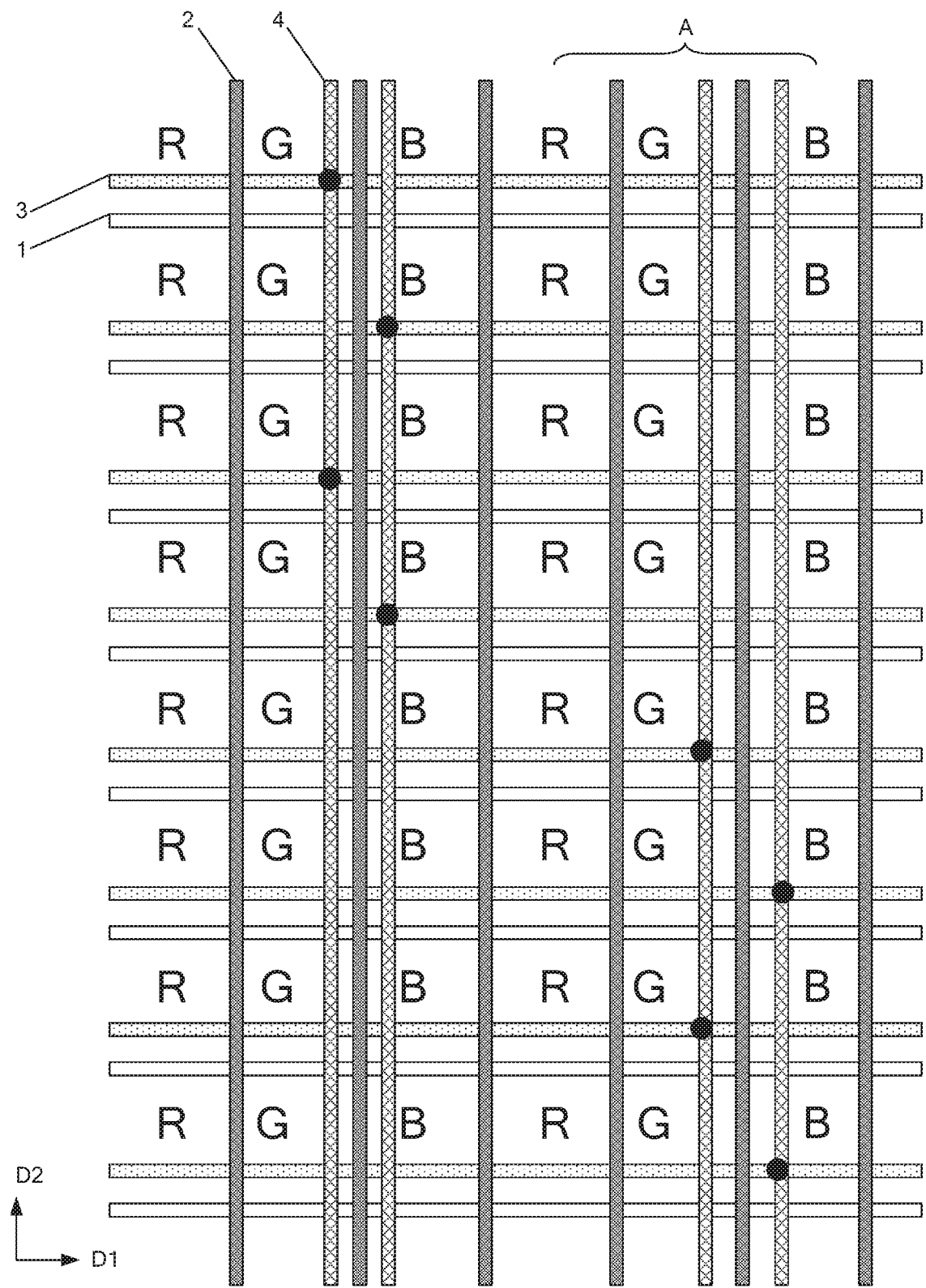
FIG. 9 is a schematic diagram illustrating a distribution of common voltage input lines in a display substrate according to an embodiment of the present disclosure.

In an embodiment, as shown in FIGS. 7 to 9, a display substrate is provided, the display substrate has a structure substantially the same as that of the display substrate described with reference to FIGS. 2 to 6, except that each common voltage input line group includes a plurality of common voltage input lines 4, and the common voltage input lines 4 in different groups are connected to different common electrode lines 3; each common voltage input line group is arranged corresponding to the column of the pixel unit A.

Next, an example, in which each common voltage input line group includes two common voltage input lines 4 and each common voltage input line group corresponds to one column of pixel units A, will be described.

As shown in FIG. 7, sub-pixels in four rows and six columns two columns of pixel units A) defined by four gate lines 1 and six data lines 2 in a display substrate are illustrated. Each row of sub-pixels corresponds to one common electrode line 3, and each column of pixel units A corresponds to one common voltage input line group (i.e., two common voltage input lines 4 shown in FIG. 7). The first common voltage input line group has a first common voltage input line 4 connected with the common electrode line 3 positioned in the first row, and a second common voltage input line 4 connected with the common electrode line 3 positioned in the second row; the second common voltage input line group has a first common voltage input line 4 connected with the common electrode line 3 positioned in the third row, and a second common voltage input line 4 connected with the common electrode line 3 positioned in the fourth row; and in this case, the common voltage of the sub-pixels located in the first and second rows may be different from the common voltage of the sub-pixels located in the third and fourth rows by inputting a same voltage to the two common voltage input lines 4 of the first common voltage input line group and inputting a common voltage different from that input to the common voltage input lines 4 in the first group to the common voltage input lines 4 in the second group; that is, the common voltages in the upper and lower regions of the display substrate are different, which is beneficial for the display substrate to realize wide-viewing-angle display. Needless to say, different common voltages may also be input to the common voltage input lines 4 in each common voltage input line group, and in this case the common voltages on two adjacent common electrode lines 3 are different, that is, the common voltages in two adjacent rows of sub-pixels are different.

As shown in FIG. 8, sub-pixels in eight rows and six columns two columns of pixel units A) defined by eight gate lines 1 and six data lines 2 in a display substrate are illustrated. Each row of sub-pixels corresponds to one common electrode line 3, and each column of pixel units A corresponds to one common voltage input line group (i.e., two common voltage input lines 4 shown in FIG. 8). As shown in FIG. 8, the first common voltage input line group is connected with the first to fourth common electrode lines 3 and the second common voltage input line group is connected with the fifth to eighth common electrode lines 3. For example, the first common voltage input line group has a first common voltage input line 4 connected with the common electrode lines 3 positioned in the first and third rows, and a second common voltage input line 4 connected with the common electrode lines 3 positioned in the second and fourth rows; and the second common voltage input line group has a first common voltage input line 4 connected with the common electrode lines 3 positioned in the fifth and seventh rows, and a second common voltage input line 4 connected with the common electrode lines 3 positioned in the sixth and eighth rows. In this case, the common voltage of the sub-pixels located in the first to fourth rows may be different from the common voltage of the sub-pixels located in the fifth and eighth rows by inputting a same voltage to the two common voltage input lines 4 of the first common voltage input line group and inputting a common voltage different from that input to the common voltage input lines 4 in the first group to the common voltage input lines 4 in the second group; that is, the common voltages in the upper and lower regions of the display substrate are different, which is beneficial for the display substrate to realize wide-viewing-angle display. Needless to say, different common voltages may also be input to the common voltage input lines 4 in each common voltage input line group, and in this case the common voltages on two adjacent common electrode lines 3 are different, that is, the common voltages in two adjacent rows of sub-pixels are different.

Since the connection of the common voltage input lines 4 with the common electrode lines 3 is required to be achieved through via holes penetrating through the interlayer insulating layer 7 therebetween, as shown in FIG. 8, the first common voltage input line 4 in the first group is connected with the common electrode lines 3 located in the first and third rows and the second common voltage input line 4 in the first group is connected with the common electrode lines 3 located in the second and fourth rows; and the first common voltage input line 4 in the second group is connected with the common electrode lines 3 located in the fifth row and the seventh row and the second common voltage input line 4 in the second group is connected with the common electrode lines 3 located in the sixth row and the eighth row, so that the positions of the via holes can be uniformly distributed, and the display is uniform. Needless to say, the connection manner of each common voltage input line group is not limited to the above manner. In an embodiment, every two adjacent common electrode lines 3 may be connected to a same common voltage input line 4, or other connection manners may be adopted. In any of the above display substrate structures, the two common voltage input lines 4 in each common voltage input line group may be located on a same side of a same data line 2 as shown in FIG. 8, or the two common voltage input lines 4 in each common voltage input line group may be respectively located on two sides of a same data line 2 as shown in FIG. 9.

An embodiment of the present disclosure further provides a method for fabricating a display substrate, and the display substrate is any one of the display substrates in the above embodiments.

Next, an example of fabricating a display substrate shown in FIG. 2 will be described. A cross-sectional view of the display substrate taken along line C-C' is shown in FIG. 10, and the method may include the following steps S1 to S3.

In step S1, a pattern including a gate line 1 and a common electrode line 3 is formed on a substrate 10 through a patterning process.

For example, the gate line 1 and the common electrode line 3 may be formed using a single patterning process. In step S1, a low-resistance metal material may be formed on the substrate 10 by a physical vapor deposition method such as magnetron sputtering, and a pattern including the gate line 1 and the common electrode line 3 may be formed by a photolithography process. The materials of the gate line 1 and the common electrode line 3 may include, but are not limited to, a single-layer metal such as Al, Cu, Mo, or AlNd; or a composite film material such as Mo/Al/Mo or Ti/Al/Ti.

In step S2, on the substrate 10 subjected to the above step S1, an interlayer insulating layer 7 is formed, and a via hole for connecting the common voltage input line 4 and the common electrode line 3 is formed in the interlayer insulating layer 7.

For example, the material of the interlayer insulating layer 7 may include, but is not limited to, $SiO_2$ or a SiN single-layer film or composite film.

In step S3, a pattern including a data line 2 and a common voltage input line 4 is formed on the substrate 10 subjected to the above step S2.

For example, the data line 2 and the common voltage input line 4 may be formed using a single patterning process. In step S3, a low-resistance metal material may be formed on the substrate 10 by a physical vapor deposition method such as magnetron sputtering, and a pattern including the data line 2 and the common voltage input line 4 may be formed by a photolithography process. The materials of the data line 2 and the common voltage input line 4 may include, but are not limited to, a single-layer metal such as Al, Cu, Mo, or AlNd; or a composite film material such as Mo/Al/Mo or Ti/Al/Ti.

In another aspect, an embodiment of the present disclosure also provides a display device, which includes any one of the display substrates described herein.

Since the display device includes any of the display substrates described herein, it is advantageous to realize wide-viewing-angle display.

The display device may be a liquid crystal display device, and for example, the display device includes any product or component with a display function, such as a liquid crystal panel, a mobile phone, a tablet computer, a television, a display, a notebook computer, a digital photo frame, a navigator and the like.

It will be understood that the above embodiments are merely exemplary embodiments employed to illustrate the principles of the present disclosure, and the present disclosure is not limited thereto. It will be apparent to those skilled in the art that various changes and modifications may be made without departing from the spirit and scope of the present disclosure, and these changes and modifications are to be considered within the scope of the present disclosure.

What is claimed is:

1. A display substrate, comprising:
  a plurality of gate lines, each of the plurality of gate lines extending in a first direction;
  a plurality of data lines, each of the plurality of data lines extending in a second direction substantially perpendicular to the first direction, the plurality of gate lines and the plurality of data lines being arranged to intersect to define a plurality of sub-pixels arranged in a plurality of rows and a plurality of columns, every multiple sub-pixels in a same row constituting a pixel unit; and
  a plurality of common electrode lines, each of the plurality of common electrode lines extending in the first direction and located between adjacent two of the plurality of gate lines and configured to supply a common voltage to sub-pixels of the plurality of sub-pixels in a same row;
  wherein the display substrate further comprises: a plurality of common voltage input line groups extending in the second direction and intersecting with the plurality of common electrode lines;
  wherein common voltage input lines in different groups of the plurality of common voltage input line groups are electrically connected to different common electrode lines of the plurality of common electrode lines, respectively, and among the plurality of common electrode lines, each common electrode line electrically connected to a common voltage input line group of the plurality of common voltage input line groups is different from each common electrode line electrically connected to another common voltage input line group of the plurality of common voltage input line groups, wherein each common electrode line of the plurality of common electrode lines is connected to only one of each common voltage input line of the plurality of common voltage input line groups, wherein the plurality of common electrode lines are divided into a plurality of groups and each group of the plurality of groups of the plurality of common electrode lines is connected to a same common voltage input line of the plurality of common voltage input line groups; and
  an orthographic projection of every N columns of pixel units on a substrate covers an orthographic projection of a corresponding common voltage input line group of the plurality of common voltage input line groups on the substrate, where N is an integer greater than or equal to 1.

2. The display substrate of claim 1, further comprising a common voltage supply circuit; wherein
  the common voltage supply circuit is electrically connected with the plurality of common voltage input line groups and is configured to provide different common voltages to at least part of common voltage input lines in different groups.

3. The display substrate of claim 1, wherein the multiple sub-pixels comprise a red sub-pixel, a green sub-pixel, and a blue sub-pixel; and sub-pixels of the plurality of sub-pixels in a same column has a same color; and
  wherein the orthographic projection of the corresponding common voltage input line group on the substrate is within an orthographic projection of a corresponding column of green sub-pixels on the substrate.

4. The display substrate of claim 1, wherein the corresponding common voltage input line group comprises one common voltage input line; and
  the one common voltage input line is electrically connected with multiple adjacent common electrode lines of the plurality of common electrode lines.

5. The display substrate of claim 1, wherein the corresponding common voltage input line group comprises a plurality of common voltage input lines; and
  each of the plurality of common voltage input lines is electrically connected with a corresponding one of the plurality of common electrode lines, the plurality of common voltage input lines are electrically connected with different common electrode lines, and the different common electrode lines are adjacent.

6. The display substrate of claim 1, wherein the corresponding common voltage input line group comprises a plurality of common voltage input lines; and each of the plurality of common voltage input lines is electrically connected with multiple common electrode lines of the plurality of common electrode lines, the multiple common electrode lines electrically connected with one of the plurality of common voltage input lines are different from the multiple common electrode lines electrically connected with another one of the plurality of common voltage input lines, and all the common electrode lines electrically connected to the plurality of common voltage input lines are adjacent.

7. The display substrate of claim 5, wherein the corresponding common voltage input line group comprises two common voltage input lines, and the two common voltage input lines are on a same side of a corresponding one of the plurality of data lines.

8. The display substrate of claim 5, wherein the corresponding common voltage input line group comprises two common voltage input lines, and the two common voltage input lines are located at two sides of a corresponding one of the plurality of data lines, respectively.

9. The display substrate of claim 1, wherein a layer where the plurality of common electrode lines are disposed and a layer where the plurality of common voltage input line groups are disposed are sequentially disposed in a direction away from the substrate, and an interlayer insulating layer is disposed between the layer where the plurality of common electrode lines are disposed and the layer where the plurality of common voltage input line groups are disposed, a via hole is disposed at a position of the interlayer insulating layer corresponding to an intersection of a common electrode line and a common voltage input line, and the common electrode line and the common voltage input line are electrically connected through the via hole.

10. The display substrate of claim 9, wherein the display substrate further comprises an auxiliary connection portion; the auxiliary connection portion is arranged at the intersection of the common electrode line and the common voltage input line and is connected with the common electrode line as an integral structure.

11. The display substrate of claim 9, wherein the display substrate further comprises an auxiliary connection portion; the auxiliary connection portion is arranged at a position corresponding to the via hole and is connected with the common electrode line as an integral structure.

12. The display substrate of claim 1, wherein each of the plurality of common electrode lines comprises a plurality of common sub-electrode lines, and first ends of the plurality of common sub-electrode lines are connected together and second ends of the plurality of common sub-electrode lines are connected together.

13. The display substrate of claim 1, wherein the plurality of common voltage input line groups extend to a fan-out region; a plurality of signal input lines are arranged in the fan-out region;

an extending direction of the plurality of signal input lines is perpendicular to an extending direction of the plurality of common voltage input line groups; and each common voltage input line is connected with a corresponding one of the plurality of signal input lines.

14. A display device, comprising the display substrate of claim 1.

15. The display substrate of claim 2, wherein the corresponding common voltage input line group comprises one common voltage input line; and the one common voltage input line is electrically connected with multiple adjacent common electrode lines of the plurality of common electrode lines.

16. The display substrate of claim 3, wherein the corresponding common voltage input line group comprises one common voltage input line; and the one common voltage input line is electrically connected with multiple adjacent common electrode lines of the plurality of common electrode lines.

17. The display substrate of claim 2, wherein the corresponding common voltage input line group comprises a plurality of common voltage input lines; and each of the plurality of common voltage input lines is electrically connected with a corresponding one of the plurality of common electrode lines, the plurality of common voltage input lines are electrically connected with different common electrode lines, and the different common electrode lines are adjacent.

18. The display substrate of claim 2, wherein the corresponding common voltage input line group comprises a plurality of common voltage input lines; and each of the plurality of common voltage input lines is electrically connected with multiple common electrode lines of the plurality of common electrode lines, the multiple common electrode lines electrically connected with one of the plurality of common voltage input lines are different from the multiple common electrode lines electrically connected with another one of the plurality of common voltage input lines, and all the common electrode lines electrically connected to the plurality of common voltage input lines are adjacent.

19. The display substrate of claim 6, wherein the corresponding common voltage input line group comprises two common voltage input lines, and the two common voltage input lines are on a same side of a corresponding one of the plurality of data lines.

20. The display substrate of claim 6, wherein the corresponding common voltage input line group comprises two common voltage input lines, and the two common voltage input lines are located at two sides of a corresponding one of the plurality of data lines, respectively.

* * * * *